(12) United States Patent
Lee et al.

(10) Patent No.: US 12,725,766 B2
(45) Date of Patent: Sep. 1, 2026

(54) SEMICONDUCTOR PROCESS DEVICE INCLUDING ELECTROMAGNET FOR CONTROLLING PLASMA

(71) Applicant: SAMSUNG ELECTRONICS CO., LTD., Suwon-si (KR)

(72) Inventors: Jimo Lee, Suwon-si (KR); Donghyeon Na, Suwon-si (KR); Kyung-Sun Kim, Suwon-si (KR); Sunjin Kim, Suwon-si (KR); Yongsang Kim, Suwon-si (KR); Jong In Park, Suwon-si (KR); Changgil Son, Suwon-si (KR); Seungbo Shim, Suwon-si (KR); Hoyoung Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 28 days.

(21) Appl. No.: 19/066,648

(22) Filed: Feb. 28, 2025

(65) Prior Publication Data

US 2026/0051464 A1 Feb. 19, 2026

(30) Foreign Application Priority Data

Aug. 14, 2024 (KR) ........................ 10-2024-0109244

(51) Int. Cl.
*H01J 37/32* (2006.01)

(52) U.S. Cl.
CPC .. *H01J 37/32669* (2013.01); *H01J 37/32091* (2013.01); *H01J 37/32183* (2013.01); *H01J 2237/332* (2013.01); *H01J 2237/334* (2013.01)

(58) Field of Classification Search
CPC .. H05H 1/46; H05H 1/34; H05H 1/54; H05H 1/4652; H05H 1/4645; H05H 1/24;
(Continued)

(56) References Cited

U.S. PATENT DOCUMENTS

| | | | |
|---|---|---|---|
| 10,074,545 | B2 | 9/2018 | Kondo |
| 10,297,428 | B2 | 5/2019 | Yokota et al. |

(Continued)

FOREIGN PATENT DOCUMENTS

| | | | |
|---|---|---|---|
| KR | 10-2130569 | B1 | 7/2020 |
| KR | 10-2148005 | B1 | 8/2020 |
| KR | 10-2472651 | B1 | 11/2022 |

*Primary Examiner* — Monica C King
(74) *Attorney, Agent, or Firm* — Morgan, Lewis & Bockius LLP

(57) ABSTRACT

According to embodiments of the present inventive concept, a semiconductor process device includes: a chamber; a gas supplier supplying a reactant gas into the chamber; a first plasma electrode disposed in the chamber; a second plasma electrode disposed in the chamber; a plurality of electromagnets configured to generate a plurality of magnetic field components, respectively, to control a density of a plasma region that is formed between the first and second plasma electrodes; and a current supplier configured to supply a plurality of currents to the plurality of electromagnets, respectively, wherein among the plurality of electromagnets, a first electromagnet is disposed closest to the plasma region, wherein a center region of the plasma region is affected by the first electromagnet and has a first diameter, and wherein the first electromagnet has a second diameter less than or equal to the first diameter.

20 Claims, 9 Drawing Sheets

(58) Field of Classification Search
CPC .. H05H 2242/20; H05H 1/2441; H05H 1/245; H05H 2245/15; H05H 1/0012; H05H 1/0018; H05H 11/00; H05H 1/30; H05H 1/26; H05H 2240/00; H05H 1/18; H05H 1/2465; H05H 1/463; H05H 1/2406; H05H 1/36; H05H 1/44; H05H 2245/42; H05H 2245/50; H05H 1/0081; H05H 1/3457; H05H 1/3494; H05H 1/466; H05H 3/00; H05H 1/0006; H05H 1/0025; H05H 1/3431; H05H 1/4697; H05H 1/48; H05H 2245/10; H05H 2245/17; H05H 2245/36; H01L 21/3065; H01L 21/311; C23C 16/509; C23C 16/511; C23C 16/50; B01J 19/08
See application file for complete search history.

(56) References Cited

U.S. PATENT DOCUMENTS

| | | | | |
|---|---|---|---|---|
| 10,651,012 | B2 | 5/2020 | Yokota et al. | |
| 11,295,935 | B2 | 4/2022 | Ohashi et al. | |
| 2023/0051124 | A1* | 2/2023 | Guo | G21B 1/05 |
| 2023/0282449 | A1 | 9/2023 | Likhanskii et al. | |
| 2023/0386800 | A1 | 11/2023 | Niizeki et al. | |
| 2024/0120177 | A1* | 4/2024 | Lee | H01J 37/32669 |

* cited by examiner

100
Current Supplier (150)
DCN
DC2
DC1
14N
142
c
b
a
141
1st Plasma Electrode (131)
WF
2nd Plasma Electrode (132)
Gas Supplier (120)
110
Plasma Region
Center Region
D1
D2
D3

Center Region
SCD1a
SCD1b
SCD2a
SCD2b
SCD [nm]
d1a
d1b
d2a
d2b
10
8
6
4
2
0
-2
-4
-6
-8
0
20
p1
40
a/2
60
p2
80
100
120
140
160
Radial position [mm]
Without electromagnets
With conventional electromagnets

Figure 7:
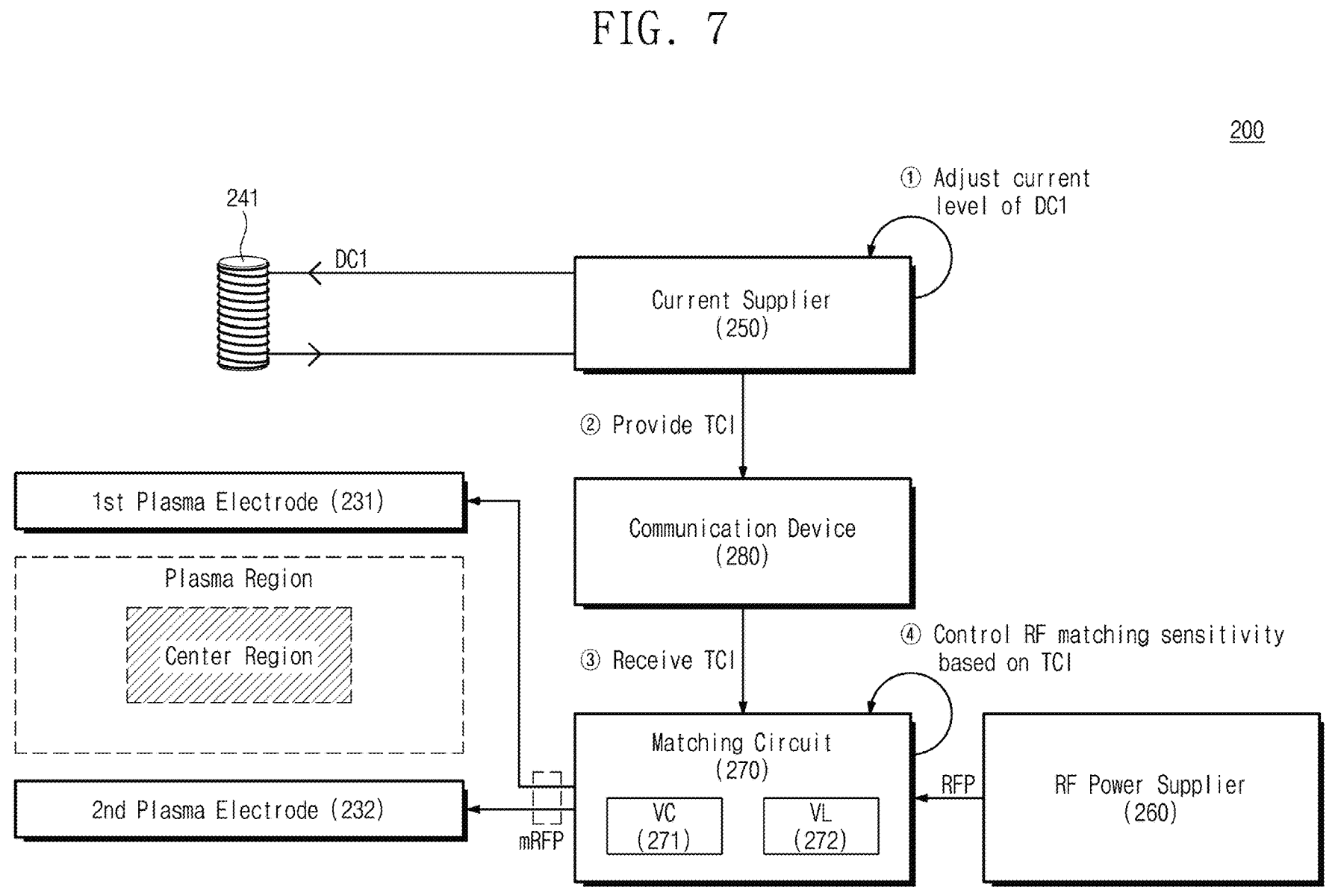

① Adjust current level of DC1

Current Supplier (250)

② Provide TCI

Communication Device (280)

③ Receive TCI

④ Control RF matching sensitivity based on TCI

Matching Circuit (270)

VC (271)

VL (272)

RF Power Supplier (260)

RFP mRFP

DC1

241

1st Plasma Electrode (231)

Plasma Region

Center Region

2nd Plasma Electrode (232)

SEMICONDUCTOR PROCESS DEVICE INCLUDING ELECTROMAGNET FOR CONTROLLING PLASMA

CROSS-REFERENCE TO RELATED APPLICATION

This application claims priority under 35 U.S. C. § 119 to Korean Patent Application No. 10-2024-0109244 filed on Aug. 14, 2024, in the Korean Intellectual Property Office, the disclosure of which is incorporated by reference herein in its entirety.

TECHNICAL FIELD

Embodiments of the present inventive concept described herein relate to a semiconductor process device, and more particularly, to a semiconductor process device including an electromagnet for controlling plasma.

DISCUSSION OF THE RELATED ART

A semiconductor element or device may be manufactured through various processes. For example, the semiconductor element or device may be manufactured by performing a photo process, an etching process, a deposition process, a plating process, and the like on a wafer. Plasma may be used in the etching process and the deposition process that are performed on the wafer. To generate and/or control the plasma, RF power may be applied to a semiconductor process device. The behavior of the plasma may vary depending on the form of the RF power.

A magnetic field may be applied to the semiconductor process device to control the plasma. The plasma may nonlinearly operate with respect to the strength of the magnetic field. Accordingly, the use of electromagnets that generate the magnetic field to appropriately control the plasma along with the semiconductor process device are currently under development.

SUMMARY

According to embodiments of the present inventive concept, a semiconductor process device includes: a chamber; a gas supplier configured to supply a reactant gas into the chamber; a first plasma electrode disposed in the chamber; a second plasma electrode disposed in the chamber and spaced apart from the first plasma electrode in a first direction; a plurality of electromagnets configured to generate a plurality of magnetic field components, respectively, to control a density of a plasma region that is formed between the first and second plasma electrodes; and a current supplier configured to supply a plurality of currents to the plurality of electromagnets, respectively, wherein among the plurality of electromagnets, a first electromagnet is disposed closest to the plasma region, wherein a center region of the plasma region is affected by the first electromagnet and has a first diameter in a second direction that is perpendicular to the first direction, and wherein the first electromagnet has a second diameter less than or equal to the first diameter in the second direction.

According to embodiments of the present inventive concept, a semiconductor process device includes: a chamber; a gas supplier configured to supply a reactant gas into the chamber; a first plasma electrode disposed in the chamber; a second plasma electrode disposed in the chamber and spaced apart from the first plasma electrode in a first direction; an electromagnet configured to generate a magnetic field component to control a density of a plasma region that is formed between the first and second plasma electrodes; and a current supplier configured to supply a current to the electromagnet, wherein the electromagnet is disposed inside the chamber, wherein a center region of the plasma region is affected by the electromagnet and has a first diameter in a second direction that is perpendicular to the first direction, and wherein the electromagnet has a second diameter less than or equal to the first diameter in the second direction.

According to embodiments of the present inventive concept, a semiconductor process device includes: a chamber; a gas supplier configured to supply a reactant gas into the chamber; a first plasma electrode disposed in the chamber; a second plasma electrode disposed in the chamber and spaced apart from the first plasma electrode; a first electromagnet and a second electromagnet configured to generate a first magnetic field component and a second magnetic field component, respectively, to control a density of a plasma region that is formed between the first and second plasma electrodes; and a current supplier configured to supply a first current and a second current to the first electromagnet and the second electromagnet, respectively, wherein the first electromagnet is disposed inside the chamber, wherein the second electromagnet is disposed outside the chamber, wherein a center region of the plasma region is affected by the first electromagnet and independent of the second electromagnet, wherein the center region has a first diameter, and wherein the first electromagnet has a second diameter less than or equal to the first diameter.

According to embodiments of the present inventive concept, a semiconductor process device includes: a chamber; a gas supplier configured to supply a reactant gas into the chamber; a first plasma electrode disposed in the chamber; a second plasma electrode disposed in the chamber and spaced apart from the first plasma electrode; a plurality of electromagnets configured to generate a plurality of magnetic field components, respectively, to control a density of a plasma region that is formed between the first plasma electrode and second plasma electrode; and a current supplier configured to supply a plurality of currents to the plurality of electromagnets, respectively, wherein a first electromagnet of the plurality of electromagnets is disposed between the plasma region and remaining electromagnets of the plurality of electromagnets, wherein a center region of the plasma region is affected by the first electromagnet, and wherein the first electromagnet overlaps the center region of the plasma region.

In embodiments of the present inventive concept, among the plurality of currents, a first current is provided to the first electromagnet and has a first current level and a second current level that is different from the first current level.

In embodiments of the present inventive concept, the first electromagnet generates a first magnetic field component having a first strength based on the first current level and the first magnetic field component having a second strength based on the second current level.

In embodiments of the present inventive concept, the remaining electromagnets are disposed above the first electromagnet, and each of the remaining electromagnets includes a diameter that is larger than a diameter of the first electromagnet.

BRIEF DESCRIPTION OF THE FIGURES

The above and other objects and features of the present inventive concept will become apparent by describing in detail embodiments thereof with reference to the accompanying drawings.

FIG. 7 is a view illustrating a semiconductor process device according to embodiments of the present inventive concept.

DETAILED DESCRIPTION OF THE EMBODIMENTS

Figure 1:
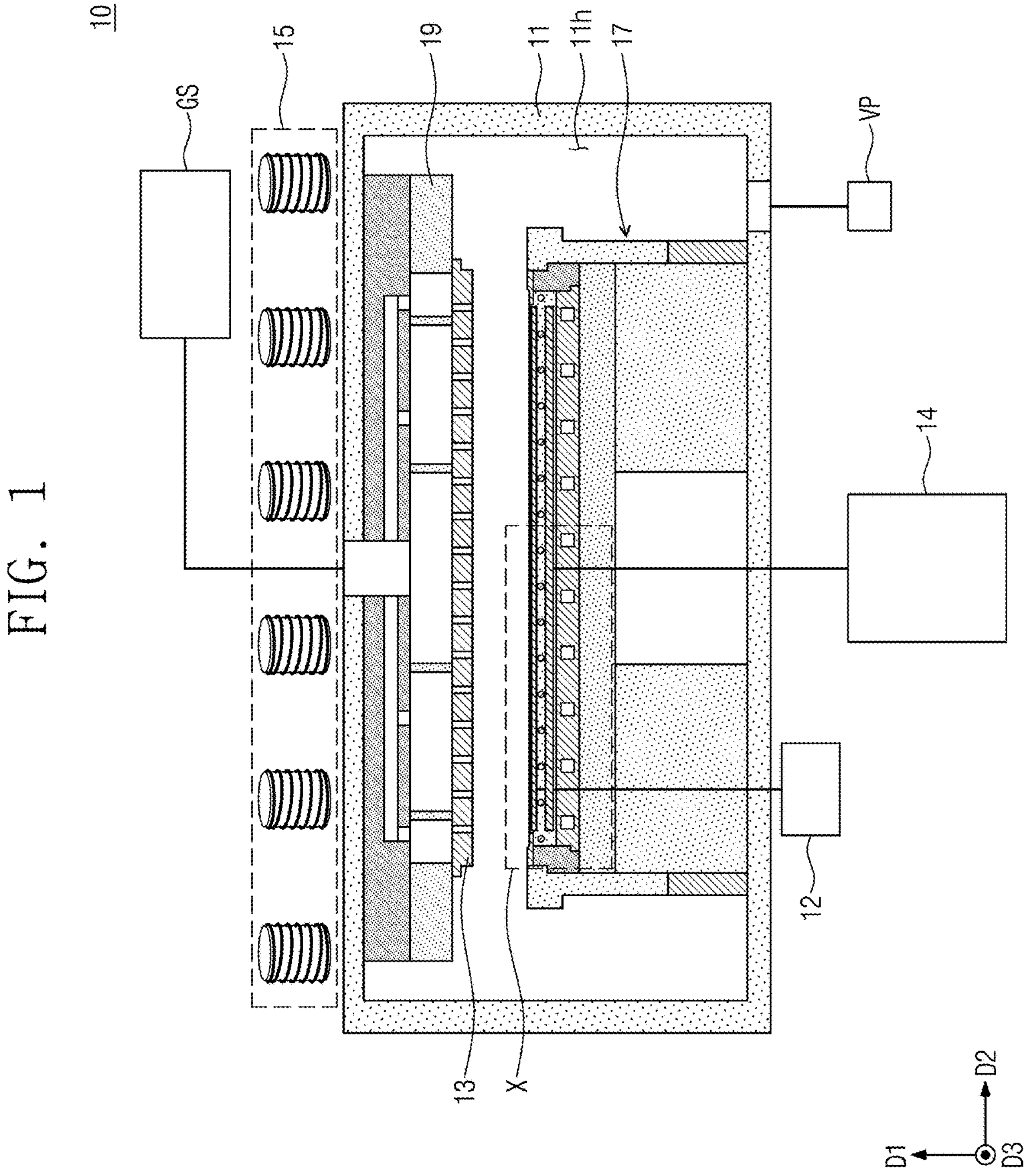
FIG. 1 is a view illustrating a conventional semiconductor process device.

Hereinafter, the present inventive concept will be described in detail by describing embodiments of the present inventive concept with reference to the attached drawings. In the figures and specification, like reference numerals may denote like elements or features, and thus their descriptions may be omitted.

Embodiments of the present inventive concept relate to a semiconductor process device that uses electromagnet configurations to control plasma density more effectively during wafer processing, such as etching or deposition. Plasma uniformity is important in semiconductor manufacturing, as it may directly impact the precision and quality of etched patterns on wafers. Conventional devices often struggle to control plasma in the center region, leading to errors like skew of critical dimensions (SCD). Embodiments of the present inventive concept overcome such limitations by employing an arrangement of electromagnets and current supply mechanisms to achieve better control and precision of plasma.

According to embodiments of the present inventive concept, the semiconductor process device may include a first electromagnet that is positioned closest to the plasma region. This electromagnet may have a diameter equal to or smaller than the diameter of the plasma's center region, allowing it to exert direct influence over the plasma density in this area. Unlike conventional systems, where central plasma regions are often uncontrolled, embodiments of the present inventive concept may effectively control plasma density in the center, minimizing SCD and increasing process accuracy. Other larger electromagnets may be placed farther from the plasma to provide supplementary control for the surrounding regions.

The current supplier is designed to provide precise, independent currents to each electromagnet. The current supplier may vary these currents dynamically, using techniques such as cyclic current modulation and ramping to smoothly transition between current levels. This dynamic control may avoid abrupt changes in plasma behavior, stabilizing the etching or deposition process and providing uniform results. The semiconductor process device may also incorporate impedance matching for the RF power that may be supplied to the plasma electrodes, further reducing variability and maintaining stable plasma conditions.

By implementing these features, embodiments of the present inventive concept may provide increased precision and reliability of semiconductor manufacturing processes. The semiconductor process device may minimize errors in wafer etching, may increase the uniformity of plasma density, and may allow for scalable, high-precision control.

FIG. 1 is a view illustrating a conventional semiconductor process device. Referring to FIG. 1, the semiconductor process device 10 may include a chamber 11, a DC power supplier 12, a showerhead 13, an RF power supplier 14, a plurality of conventional electromagnets 15, a stage 17, a vacuum pump VP, and a gas supply device GS.

Hereinafter, D1 may be referred to as a first direction, D2 crossing the first direction D1 may be referred to as a second direction, and D3 crossing the first direction D1 and the second direction D2 may be referred to as a third direction. For example, the first direction D1 may also be referred to as a vertical direction. In addition, for example, each of the second direction D2 and the third direction D3 may also be referred to as a horizontal direction.

The conventional semiconductor process device 10 may perform an etching process and/or a deposition process on a wafer. The term "wafer" used herein may mean a silicon (Si) wafer, but the present inventive concept is not limited thereto. The conventional semiconductor process device 10 may process the wafer using plasma. To achieve this, the conventional semiconductor process device 10 may generate the plasma in various ways. For example, the semiconductor process device 10 may be capacitively coupled plasmas (CCP) equipment and/or inductively coupled plasmas (ICP) equipment. However, hereinafter, for convenience, the semiconductor process device 10 is illustrated and described based on CCP.

The chamber 11 may provide a process space 11*h* therein. A process for the wafer may be performed in the process space 11*h*. The process space 11*h* may be separated from an outer space by the chamber 11, which encloses the process space 11*h*. During the process for the wafer, the process space 11*h* may be in a substantial vacuum state. The chamber 11 may have a cylindrical shape, but the present inventive concept is not limited thereto.

The stage 17 may be located in the chamber 11. That is, the stage 17 may be located in the process space 11*h*. The stage 17 may support and/or fix the wafer. The process for the wafer may be performed on the wafer when the wafer is in a state in which the wafer is seated on the stage 17.

The showerhead 13 may be located in the chamber 11. For example, the showerhead 13 may be located in the process space 11*h*. The showerhead 13 may be spaced apart from the stage 17 in the first direction D1. For example, the showerhead 13 may be fixed at a certain position in the process space 11*h* by a fixing member 19. A gas supplied from the gas supply device GS may be uniformly injected into the process space 11*h* through the showerhead 13.

The DC power supplier 12 may apply DC power to the stage 17. The wafer may be fixed at a certain position of the stage 17 as a result of the application of the DC power that is supplied from the DC power supplier 12.

The RF power supplier 14 may supply RF power to the stage 17. In this way, the plasma in the process space 11*h* may be controlled.

The plurality of conventional electromagnets 15 may generate a plurality of magnetic field components, respectively, to control the density of the plasma. To effectively control the plasma density by generating multiple magnetic field components, the conventional electromagnets 15 must have a large diameter and receive a high current.

The vacuum pump VP may be connected to the process space 11*h*. During the process for the wafer, vacuum pressure may be applied to the process space 11*h* by the vacuum pump VP.

The gas supply device GS may supply a reactant gas into the process space 11*h*. To achieve this, the gas supply device GS may include, for example, a gas tank, a compressor, and a valve. A portion of the reactant gas supplied into the process space 11*h* by the gas supply device GS may be excited into plasma.

Figure 2:
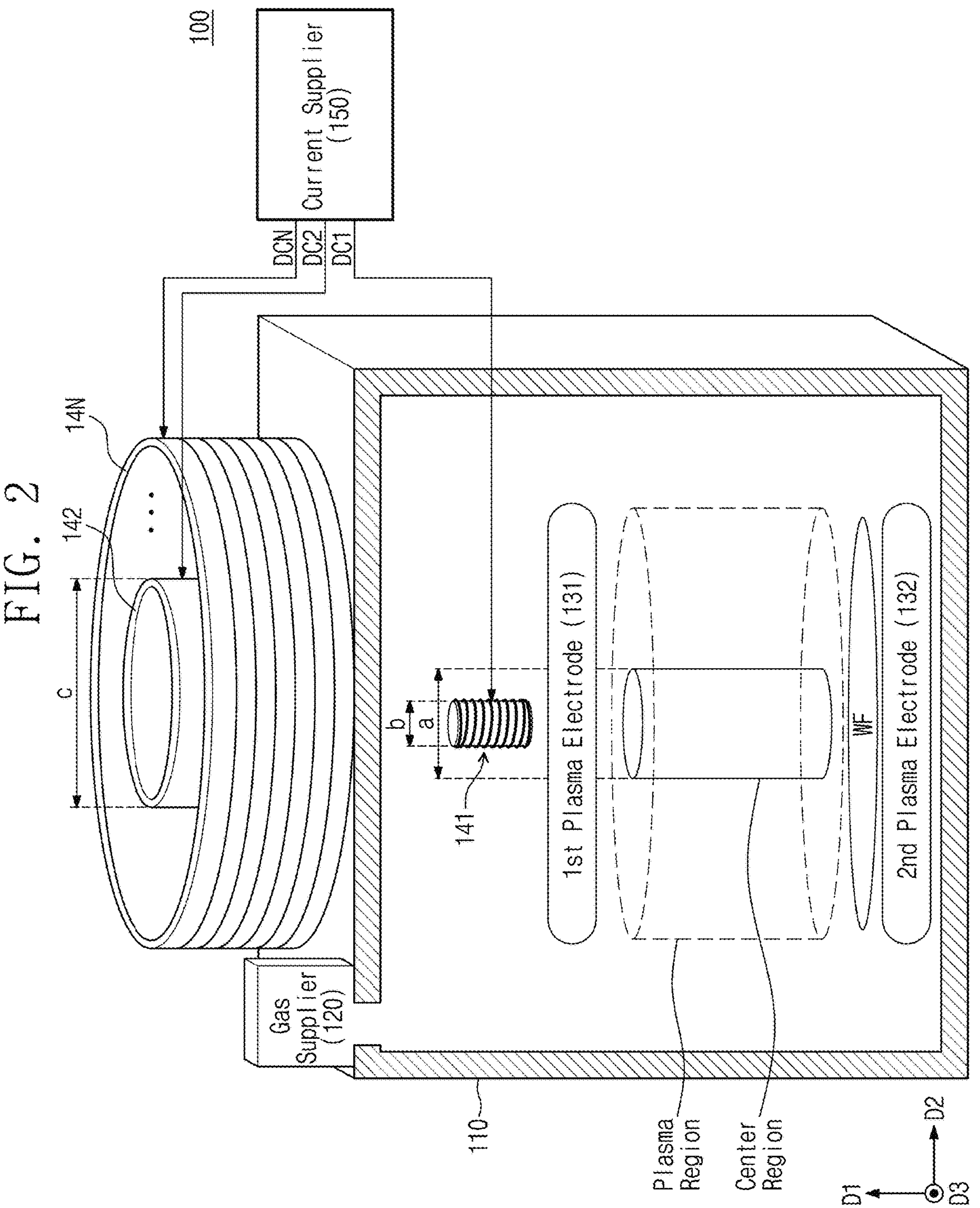
FIG. 2 is a view illustrating a semiconductor process device according to an embodiment of the present inventive concept.

FIG. 2 is a view illustrating a semiconductor process device according to an embodiment of the present inventive concept. Referring to FIG. 2, the semiconductor process device 100 may include a chamber 110, a gas supplier 120, first and second plasma electrodes 131 and 132, a plurality of electromagnets 141 to 14N, a current supplier 150, and a wafer WF.

Hereinafter, D1 may be referred to as a first direction, D2 crossing the first direction D1 may be referred to as a second direction, and D3 crossing the first direction D1 and the second direction D2 may be referred to as a third direction. For example, the first direction D1 may also be referred to as a vertical direction. In addition, for example, each of the second direction D2 and the third direction D3 may also be referred to as a horizontal direction.

The semiconductor process device 100 may perform an etching process. For example, the semiconductor process device 100 may perform the etching process on the wafer WF by using plasma. In embodiments of the present inventive concept, the semiconductor process device 100 may generate the plasma and may perform the etching process on the wafer WF by using the generated plasma. In embodiments of the present inventive concept, the semiconductor process device 100 is illustrated as CCP equipment. However, the CCP equipment is provided only for a better understanding and is not intended to limit the scope and spirit of the present inventive concept. For example, semiconductor process device 100 may be implemented as ICP equipment.

The chamber 110 may provide a process space therein. For example, the chamber 110 may provide a process space in which a process for the wafer WF is performed therein, and the process space is enclosed within the chamber 110. The chamber 110 may provide a process space that is separated from an outer space and that is in a substantial vacuum state during a process for the wafer WF (e.g., the process space of the chamber 110 may have an internal pressure of about $10^{-3}$ Torr). In embodiments of the present inventive concept, the chamber 110 is illustrated as having a rectangular parallelepiped shape. However, the rectangular parallelepiped shape is provided only for a better understanding and is not intended to limit the scope and spirit of the present inventive concept. The chamber 110 may be implemented as having any other shape.

The gas supplier 120 may provide a reactant gas. The gas supplier 120 may be the same as or similar to the showerhead 13 and the gas supply device GS of FIG. 1. For example, the gas supplier 120 may provide a reactant gas (e.g., sulfur hexafluoride ($SF_6$), hydrogen fluoride (HF), methyl ($CH_3$), methane ($CH_4$), or dinitrogen ($N_2$)) into the chamber 110, and the reactance gas may be used for performing the etching process on the wafer WF in the chamber 110.

The first plasma electrode 131 and the second plasma electrode 132 may generate a plasma region. For example, the first plasma electrode 131 and the second plasma electrode 132 may generate the plasma region by exciting a portion of the reactant gas into a plasma state. The first plasma electrode 131 and the second plasma electrode 132 may generate the plasma region by receiving RF power and exciting a portion of the reactant gas into a plasma state based on the received RF power.

In embodiments of the present inventive concept, the first plasma electrode 131 and the second plasma electrode 132 may be disposed in the chamber 110. For example, the first plasma electrode 131 may be disposed inside the chamber 110 at an upper end thereof. In addition, the second plasma electrode 132 may be spaced apart from the first plasma electrode 131 in the first direction. For example, the first plasma electrode 131 and the second plasma electrode 132 may face each other with the wafer W disposed therebetween.

The plasma region may be generated between the first plasma electrode 131 and the second plasma electrode 132. In embodiments of the present inventive concept, the plasma region is illustrated as having a cylindrical shape. However, the cylindrical shape is provided only for a better understanding and is not intended to limit the scope and spirit of the present inventive concept. The plasma region may have any other shape.

Plasma in the plasma region may be used to perform the etching process on the wafer WF. For example, plasma ions in the plasma region may be incident on the surface of the wafer WF to etch the wafer WF. For example, at this time, to minimize an error in the process, it is desirable for the plasma ions to strike the wafer's surface at a perpendicular angle (e.g., in the direction that is opposite to the first direction D1). However, the plasma ions, when not controlled, might not be incident on the surface of the wafer WF at a perpendicular angle due to several factors such as non-uniformity of plasma density in the plasma region and variations in plasma sheath thickness.

When the plasma ions are not incident on the surface of the wafer WF at a perpendicular angle, skew of critical dimension (SCD) may occur. The SCD may indicate the distance, in the second direction D2, between the center of the top and the center of bottom of an etched feature that is on of the wafer WF when etching occurs in the direction opposite to the first direction D1. For example, the center of the top and the center of the bottom of a pattern may be misaligned with each other. That is, the SCD may indicate an error in the etching process for the wafer WF. To minimize the error in the etching process for the wafer WF, it is desirable to minimize the SCD. The SCD will be described below in more detail with reference to FIG. 3.

The conventional semiconductor process device 10 of FIG. 1 may use the plurality of conventional electromagnets 15 of FIG. 1 to control plasma density. The plurality of conventional electromagnets 15 of FIG. 1 may generate a plurality of magnetic field components, respectively, to control a plasma region (or plasma ions in the plasma region) (that is, to minimize SCD). However, in using the conventional semiconductor process device 10 of FIG. 1, there may be a portion of the plasma region that is not controlled by the plurality of magnetic field components that are generated by the plurality of conventional electromagnets 15 of FIG. 1. This region may be referred to as a center region. The center region may be a region where the SCD is not controlled (that is, not reduced) even though various levels of current are provided to the plurality of conventional electromagnets 15 of FIG. 1. In other words, the center region may be a portion of the plasma region that is independent of or not impacted by the plurality of conventional electromagnets 15 of FIG. 1.

In embodiments of the present inventive concept, a center region may have a first diameter "a" in the second direction D2 based on the center point of the plasma region. In embodiments of the present inventive concept, the center region is illustrated as having a cylindrical shape with the first diameter "a" in the second direction D2. However, the cylindrical shape is provided for a better understanding and is not intended to limit the scope and spirit of the present inventive concept. The center region may have any other shape. The center region will be described below in more detail with reference to FIG. 4.

A method of controlling the center region (or plasma density in the center region) within the plasma region is required to minimize an error in the etching process of the wafer WF.

The plurality of electromagnets 141 to 14N may generate a plurality of magnetic field components, respectively. The plurality of magnetic field components may collectively form a magnetic field in the chamber 110. N is a natural number. For example, the plurality of electromagnets 141 to 14N may generate a plurality of magnetic field components, respectively, to control the plasma region (e.g., to control the density of the plasma region or the thickness of sheath).

In embodiments of the present inventive concept, the plurality of electromagnets 141 to 14N are illustrated as having a cylindrical shape facing in the first direction D1. However, the shape of the plurality of electromagnets 141 to 14N is provided for a better understanding and is not intended to limit the scope and spirit of the present inventive concept. The plurality of electromagnets 141 to 14N may have any other shape facing in any other direction.

Among the plurality of electromagnets 141 to 14N, the first electromagnet 141 may be disposed closest to the plasma region. For example, the first electromagnet 141 may overlap the center region of the plasma region. In embodiments of the present inventive concept, the first electromagnet 141 may be disposed in the chamber 110. However, the present inventive concept is not limited thereto. For example, the first electromagnet 141 may be disposed outside the chamber 110 (e.g., on an upper portion of the chamber 110).

The first electromagnet 141 may have a second diameter "b" in the second direction D2. For example, the first electromagnet 141 may have the second diameter "b" less than or equal to the first diameter "a" in the second direction D2. The first electromagnet 141 may have the second diameter "b" in the second direction D2 to control plasma in the center region of the plasma region by exerting influence over the plasma density. For example, the first electromagnet 141 may generate a first magnetic field component on which the center region depends. For example, the first magnetic field component may be more precisely directed to control the plasma density in the center region of the plasma region. The effective control of the plasma in the central region of the plasma region by the first electromagnet 141 will be described below in more detail with reference to FIG. 5.

In embodiments of the present inventive concept, the first electromagnet 141 may have the second diameter "b" less than the diameters of conventional electromagnets that are generally used in a conventional semiconductor process device (e.g., the plurality of conventional electromagnets 15 of FIG. 1). Accordingly, under the same condition, the first electromagnet 141 may generate a magnetic field component having a lower strength than magnetic field components generated by the generally used electromagnets of a conventional semiconductor process device. To generate the first magnetic field component having a strength the same as or similar to the strengths of the magnetic field components that are generated by the generally used electromagnets, the first electromagnet 141 may receive a first current DC1, which is a high-level current, or may have a large number of coil turns. In addition, a product value of a current and coil turns of the first electromagnet 141 may be greater than product values of currents and coil turns of the plurality of conventional electromagnets 15 of FIG. 1. In other words, the first electromagnet 141 is designed to produce a stronger magnetic field than the conventional electromagnets 15 in FIG. 1 by having a higher product of current (I) and coil turns (N). This increased I×N value may enable the first electromagnet 141 to exert greater control over the plasma density, especially in areas like the center region. In embodiments of the present inventive concept, the product value of a current and coil turns of the first electromagnet 141 may be greater than product values of currents and coil turns of the remaining electromagnets 142 to 14N.

In embodiments of the present inventive concept, the first electromagnet 141 may be formed of a material (e.g., copper) having a relative magnetic permeability of about 1 (or a relative magnetic permeability very close to 1). In embodiments of the present inventive concept, a structure, which has any shape that has a relative magnetic permeability of 1 or more, may be disposed near the first electromagnet 141 or between the first electromagnet 141 and the plasma region. The structure, which has any shape, may control the distribution and strength of the magnetic field or the first magnetic field component of the first electromagnet 141. The remaining electromagnets 142 to 14N other than the first electromagnet 141 among the plurality of electromagnets 141 to 14N may be similar to the plurality of conventional electromagnets 15 of FIG. 1. The remaining electromagnets 142 to 14N may be disposed farther away from the plasma region, in the first direction D1, than the first electromagnet 141. In embodiments of the present inventive concept, the remaining electromagnets 142 to 14N are illustrated as being disposed outside the chamber 110. In embodiments of the present inventive concept, remaining electromagnets 142 to 14N may be arranged on the chamber 110 in the second direction D2. However, the present inventive concept is not limited thereto. For example, each of the remaining electromagnets 142 to 14N may be disposed inside or outside the chamber 110 and may be disposed at different distances from the plasma region in the first direction D1 (but farther away from the plasma region than the first electromagnet 141).

In embodiments of the present inventive concept, the remaining electromagnets 142 to 14N may have a third diameter "c" in the second direction. To effectively control the plasma region, the remaining electromagnets 142 to 14N may have the third diameter "c" that is greater than each of the first diameter "a" and the second diameter "b" in the second direction D2. In embodiments of the present inventive concept, the remaining electromagnets 142 to 14N are illustrated as having the third diameter "c" in the second direction D2, but the present inventive concept is not limited thereto. The remaining electromagnets 142 to 14N may have different diameters from each other in the second direction D2 and may have diameters the same as or similar to the second diameter "b"as needed.

However, the present inventive concept is not limited thereto. In embodiments of the present inventive concept, the diameters of the remaining electromagnets 142 to 14N may increase from the third diameter "c". For example, a second electromagnet 142 may have the third diameter "c", while the other electromagnets 14N may each have a diameter that is larger than the third diameter "c". Additionally, the remaining electromagnets 142 to 14N may be arranged concentrically, with each electromagnet 142 to 14N positioned within the others. The concentric arrangement of the electromagnets 142 to 14N may ensure uniform magnetic field distribution across the plasma region, with the larger electromagnets (e.g., 14N) placed further away to provide supplementary control. This configuration may allow precise tuning of the plasma density.

The current supplier 150 may provide a plurality of currents DC1 to DCN to the plurality of electromagnets 141 to 14N, respectively. For example, the current supplier 150 may provide the plurality of currents DC1 to DCN to the plurality of electromagnets 141 to 14N, respectively, such that the plurality of electromagnets 141 to 14N generate the plurality of magnetic field components, respectively.

In embodiments of the present inventive concept, the current supplier 150 may provide the plurality of currents DC1 to DCN, which are independent of one another, to the plurality of electromagnets 141 to 14N. For example, the current supplier 150 may provide the plurality of currents DC1 to DCN to the plurality of electromagnets 141 to 14N at different times or over time intervals of varying durations. In addition, the current supplier 150 may provide the plurality of currents DC1 to DCN of the same current level or different current levels to the plurality of electromagnets 141 to 14N. In embodiments of the present inventive concept, the maximum values of the plurality of currents DC1 to DCN may be determined based on thermal characteristics of corresponding to the plurality of electromagnets 141 and 14N, respectively.

In embodiments of the present inventive concept, the current supplier 150 may provide the first current DC1 having a plurality of current levels to the first electromagnet 141. For example, the first current DC1 may have a first current level and a second current level that is different from the second current level. The first electromagnet 141 may generate a first electromagnetic component having a first strength and a second strength based on the first current level and the second current level, respectively.

In embodiments of the present inventive concept, the first current DC1 may be repeated in a first cycle including a first time interval and a second time interval in sequence and may have the first current level during the first time interval and the second current level during the second time interval. The first current level and the second current level may be different from each other. In addition, the time lengths of the first time interval and the second time interval may be different from each other. For example, the first time interval of the first cycle may have a length of time that is greater than or equal to 0.1 seconds and less than or equal to 10 seconds.

In embodiments of the present inventive concept, the first current DC1 may have three or more current levels. For example, the first current DC1 may have first to third current levels. The first current DC1 may be repeated in a first cycle including first to third time intervals in sequence and may have the first current level during the first time interval, the second current level during the second time interval, and the third current level during the third time interval. The first to third current levels may be different from one another. In addition, the time lengths of the first to third time intervals may be different from one another.

In embodiments of the present inventive concept, the first current DC1 may be repeated in two or more cycles. For example, the first current DC1 may be repeated in a second cycle subsequent to the first cycle after being repeated in the first cycle including the first time interval and the second time interval. The second cycle may include the third time interval and the fourth time interval. The time lengths of the first to fourth time intervals may be different from one another.

Figure 3:
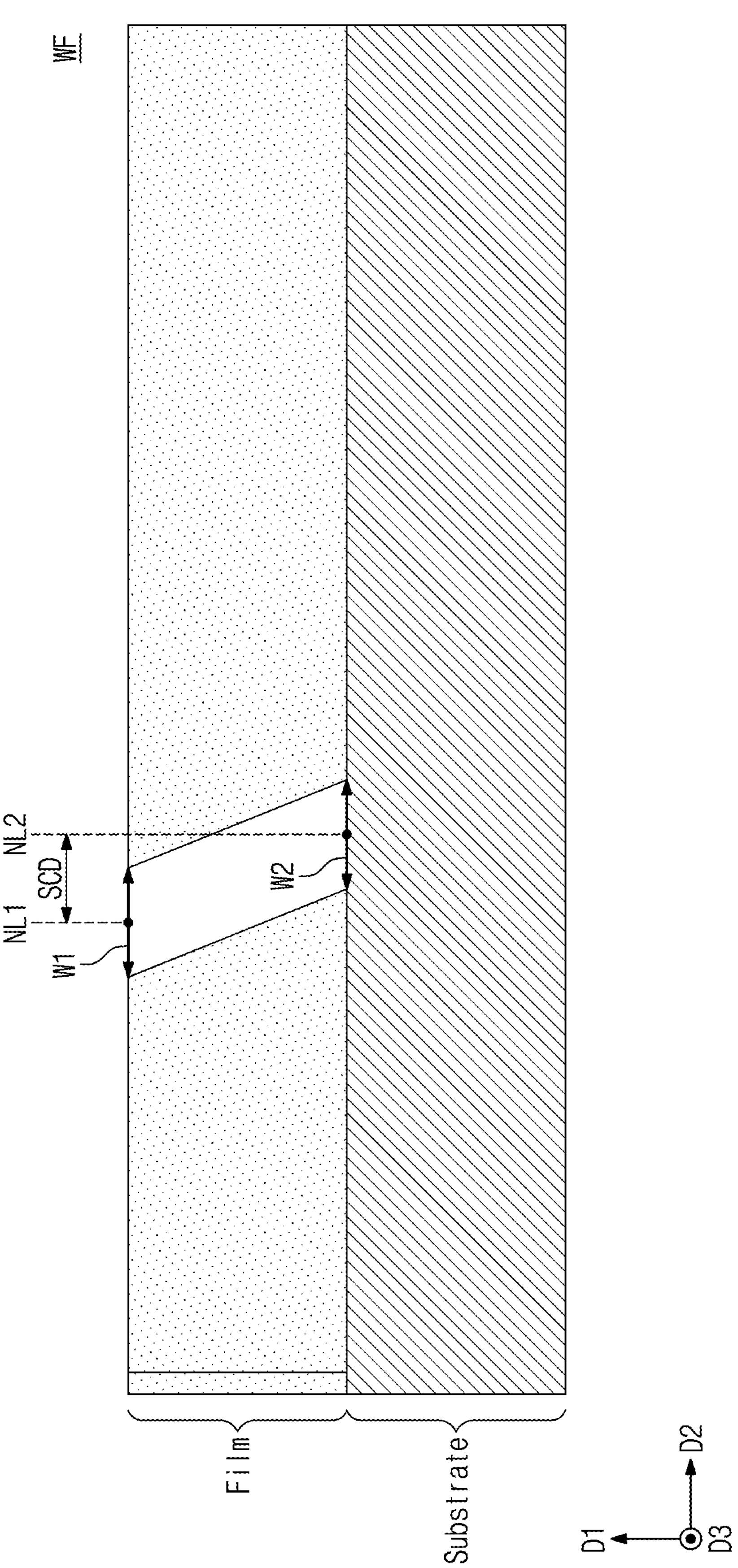
FIG. 3 is a view for explaining skew of critical dimension (SCD) as a result of a wafer being etched by plasma ions.

FIG. 3 is a view for explaining skew of critical dimension (SCD) as a result of a wafer being etched by plasma ions. Referring to FIG. 3, the wafer WF may include a film layer and a substrate layer.

The film layer may be subject to an etching process by the semiconductor process device 100 of FIG. 2. As described above with reference to FIG. 2, the film layer may be etched by plasma ions in the plasma region of FIG. 2. In a desirable situation, the film layer may be etched by plasma ions incident on the surface of the film layer at a perpendicular angle, which is in a direction that is opposite to the first direction D1. However, the plasma ions might not be incident on the surface of the wafer WF at a perpendicular angle due to several factors such as non-uniformity of plasma density in the plasma region and variations in plasma sheath thickness. That is, the film layer may be obliquely etched in a direction that deviates from the first direction D1 toward the second direction D2, which is parallel to the surface of the film layer.

The SCD may indicate how obliquely the wafer WF (or the film layer) is etched in the second direction D2. For example, the SCD may be the distance between a first normal line NL1 and a second normal line NL2. The first normal line NL1 may be a line that is vertical in the first direction D1 from the center of the upper end w1 of the etched portion of the film layer. In addition, the second normal line NL2 may be a line that is vertical in the first direction D1 from the center of the lower end w2 of the etched portion of the film layer.

When the SCD is greater or less than zero, the wafer WF may have a defect, and therefore a method for minimizing the absolute value of the SCD is required. Electromagnets capable of controlling the plasma region (or the density of the plasma region) may be used to minimize the SCD. However, as described above, the conventional electromagnets 15 of FIG. 1 may have a problem in that the conventional electromagnets 15 cannot control the plasma density in the intermediate region to reduce the SCD of the intermediate region of the plasma region. For example, the intermediate region may be an aera within the plasma region that is between the center region and outer edges of the plasma region. As described above with reference to FIG. 2, to reduce the SCD of the intermediate region, the semiconductor process device 100 of FIG. 2 may control the plasma density of the intermediate region by using the first electromagnet 141 of FIG. 2. The control of the plasma density of the intermediate region by using the first electromagnet 141 of FIG. 2 will be described below in more detail with reference to FIG. 5.

Figure 4:
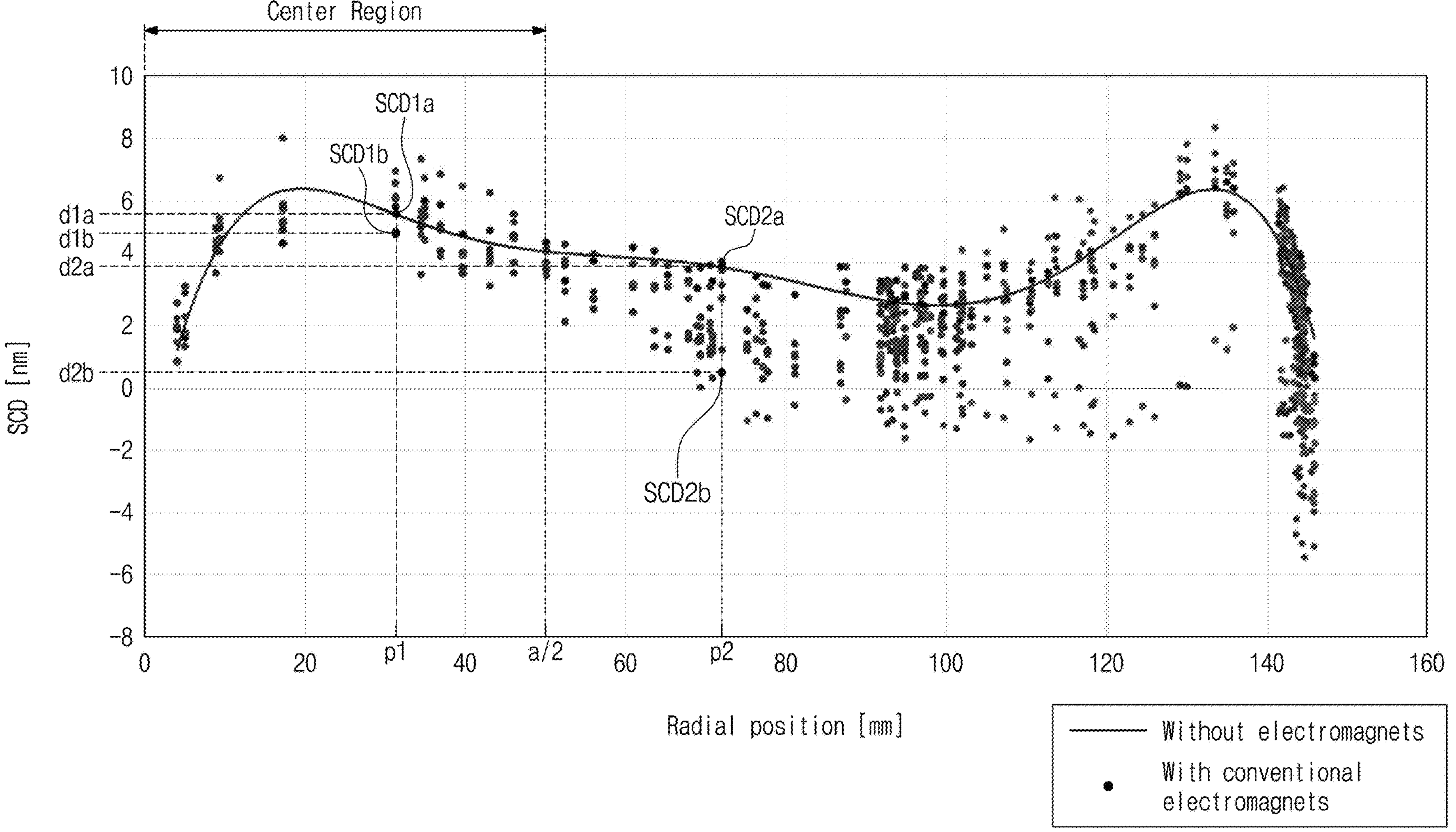
FIG. 4 is a view for explaining the SCD of the conventional semiconductor process device.

FIG. 4 is a view for explaining the SCD of the conventional semiconductor process device. Referring to FIG. 4, the horizontal axis represents a radial distance of a wafer, and the vertical axis represents SCD.

The solid line may represent the SCD of a wafer on which an etching process is performed by a semiconductor process device that does not include electromagnets. In other words, the solid line may represent the SCD of a wafer etched in a process environment where the plasma region is not influenced or controlled by a magnetic field.

In addition, each of the points may represent the SCD of the wafer of FIG. 1 on which an etching process is performed by the conventional semiconductor process device 10 of FIG. 1. The conventional semiconductor process device 10 of FIG. 1 may generate a magnetic field capable of controlling a plasma region by providing a plurality of currents of various current levels to the plurality of conventional electromagnets 15 of FIG. 1. In other words, each of the points may represent the SCD of the wafer of FIG. 1 on which an etching process is performed in a process environment in which the plasma region is controlled by the magnetic field that is generated by the conventional semiconductor process device 10.

The center region may be a portion of the plasma region that is independent of the magnetic field generated by the conventional electromagnets 15 of FIG. 1. For example, the center region may be a portion of the plasma region that is not effectively controlled by the strength of the magnetic field that is generated by the conventional electromagnets 15 of FIG. 1.

Referring to FIG. 4, the region between the radial distance of 0 mm and the radial distance of a/2 mm may be the center region. "a" may correspond to the first diameter "a" of the center region of FIG. 2. The center region may be a portion of the plasma region where the difference between the SCD in the process environment with the magnetic field that is generated by the conventional electromagnets 15 of FIG. 1 and the SCD in the process environment without electromagnets is less than a critical value. The critical value may be a positive real number. In embodiments of the present inventive concept, a/2 is illustrated as being about 50 mm, but the present inventive concept is not limited thereto. a/2 may be greater or less than about 50 mm depending on the critical value and the process environment.

For example, at the first location p1, the first SCD SCD1*a* on the solid line may be the 1a-th distance d1*a*. In addition, at the first location p1, the first SCD SCD1*b* that is the shortest of the SCDs at the points may be the 1b-th distance d1*b*. The 1a-th distance d1*a* and the 1b-th distance d1*b* may be between 4 nanometers (nm) and 6 nanometers (nm). That is, the difference between the 1a-th distance d1*a* and the 1b-th distance d1*b* may be about 2 nm or less. When the critical value is defined as 2 nm, the first location p1 may be within the center region.

The rest of the plasma region, excluding the center region, may refer to a portion of the plasma region where the difference in SCD between the process environment with the magnetic field generated by the conventional electromagnets 15 of FIG. 1 and the process environment without electromagnets is greater than the critical value.

For example, at the second location p2, the second SCD SCD2*a* on the solid line may be the 2a-th distance d2*a*. In addition, at the second location p2, the second SCD SCD2*b* that is the shortest of the SCDs at the points may be the 2b-th distance d2*b*. The 2*a-th* distance d2*a* may be about 4 nm, and the 2b-th distance d2*b* may be between 0 nm and 2 nm. That is, the difference between the 2a-th distance d2*a* and the 2*b*-th distance d2*b* may be about 2 nm or more. When the critical value is defined as 2 nm, the second location p2 might not be within the center region.

As described above, the SCD of the center region (where the radial distance is less than or equal to a/2) may be independent of or not impacted by the conventional electromagnets 15 of FIG. 1. A method of controlling the plasma density in the center region may be desirable to minimize an error in an etching process. The semiconductor process device 100 of FIG. 2, which includes the first electromagnet 141 of FIG. 2, may minimize the SCD of the center region, thereby minimizing the error in the etching process.

Figure 5:
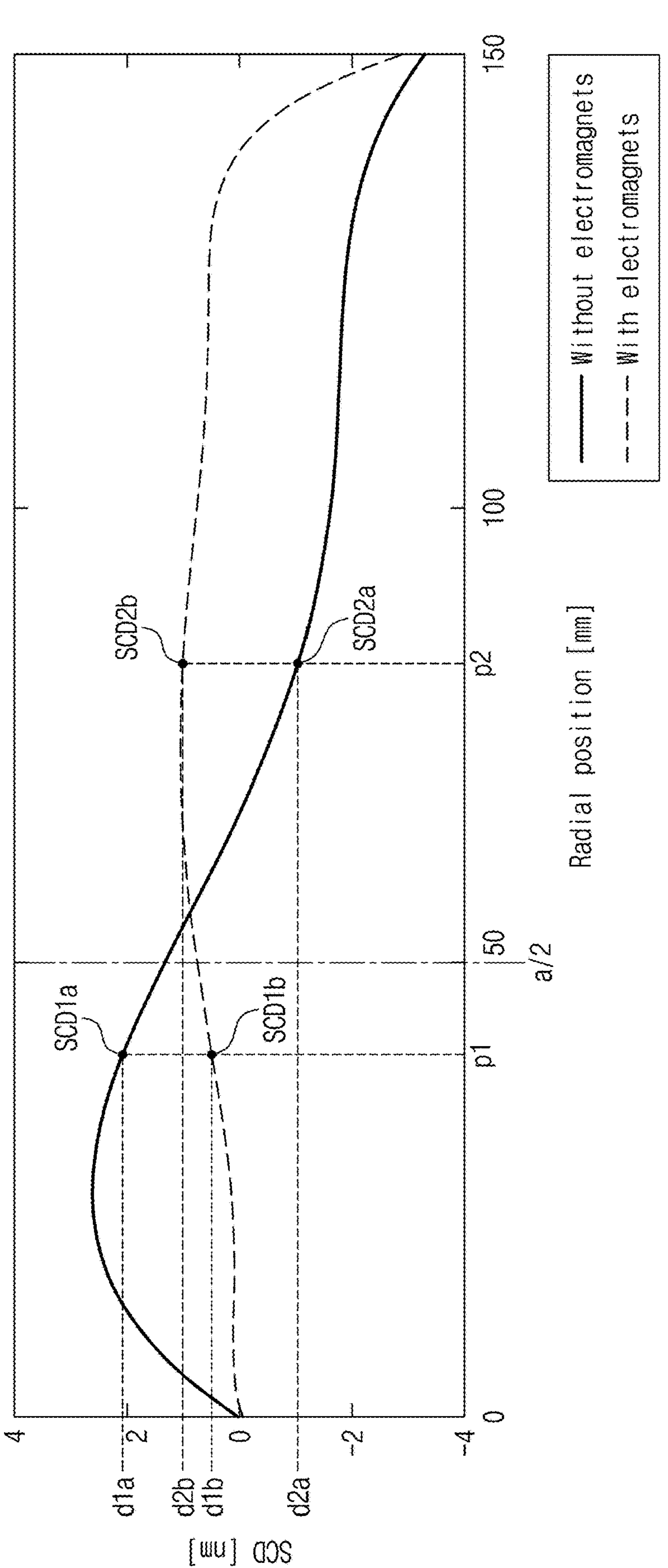
FIG. 5 is a view for explaining SCD according to embodiments of the present inventive concept.

FIG. 5 is a view for explaining SCD according to embodiments of the present inventive concept. Referring to FIG. 5, the horizontal axis represents a radial distance that is the distance from the center of the wafer WF of FIG. 2 in the second direction D2, and the vertical axis represents SCD.

The solid line may represent the SCD of a wafer on which an etching process is performed by a semiconductor process device that does not include electromagnets. In other words, the solid line may represent the SCD of a wafer on which an etching process is performed in a process environment in which a plasma region is not controlled by a magnetic field.

In addition, the dotted line may represent the SCD of the wafer of FIG. 2 on which an etching process is performed by the semiconductor process device 100 of FIG. 2, according to embodiments of the present inventive concept. The semiconductor process device 100 of FIG. 2 may generate a magnetic field capable of controlling a plasma region by providing a plurality of currents of various current levels to the plurality of electromagnets 141 to 14N of FIG. 2.

In addition, the first electromagnet 141 of FIG. 2 that is disposed closest to the plasma region and that has a diameter less than or equal to the diameter "a" of the center region may generate the first magnetic field component on which the center region depends. In other words, the generated first magnetic field component may influence and control the plasma density within the center region of the plasma region.

Referring to FIG. 5, at the first location p1 that is one location in the center region, the first SCD SCD1*a* on the solid line may be the 1a-th distance d1*a*, and the first SCD SCD1*b* on the dotted line may be the 1b-th distance d1*b*.

As described above, the SCD of the center region (where the radial distance is less than or equal to a/2) may be dependent on (e.g., influenced and controlled by) the first electromagnet 141 of FIG. 2 (because plasma ions in the center region are dependent on the first electromagnet 141 of FIG. 2). For example, the plasma ions in the center region may be controlled and influenced by the first electromagnet 141 of FIG. 2. The semiconductor process device 100 of FIG. 2 that includes the first electromagnet 141 of FIG. 2 may minimize the SCD of the center region, thereby minimizing an error in an etching process. By precisely controlling the plasma density within the center region with the first electromagnet 141 of FIG. 2, the device may ensure uniform etching, even in regions where conventional electromagnets typically fail to provide effective influence.

Figure 6:
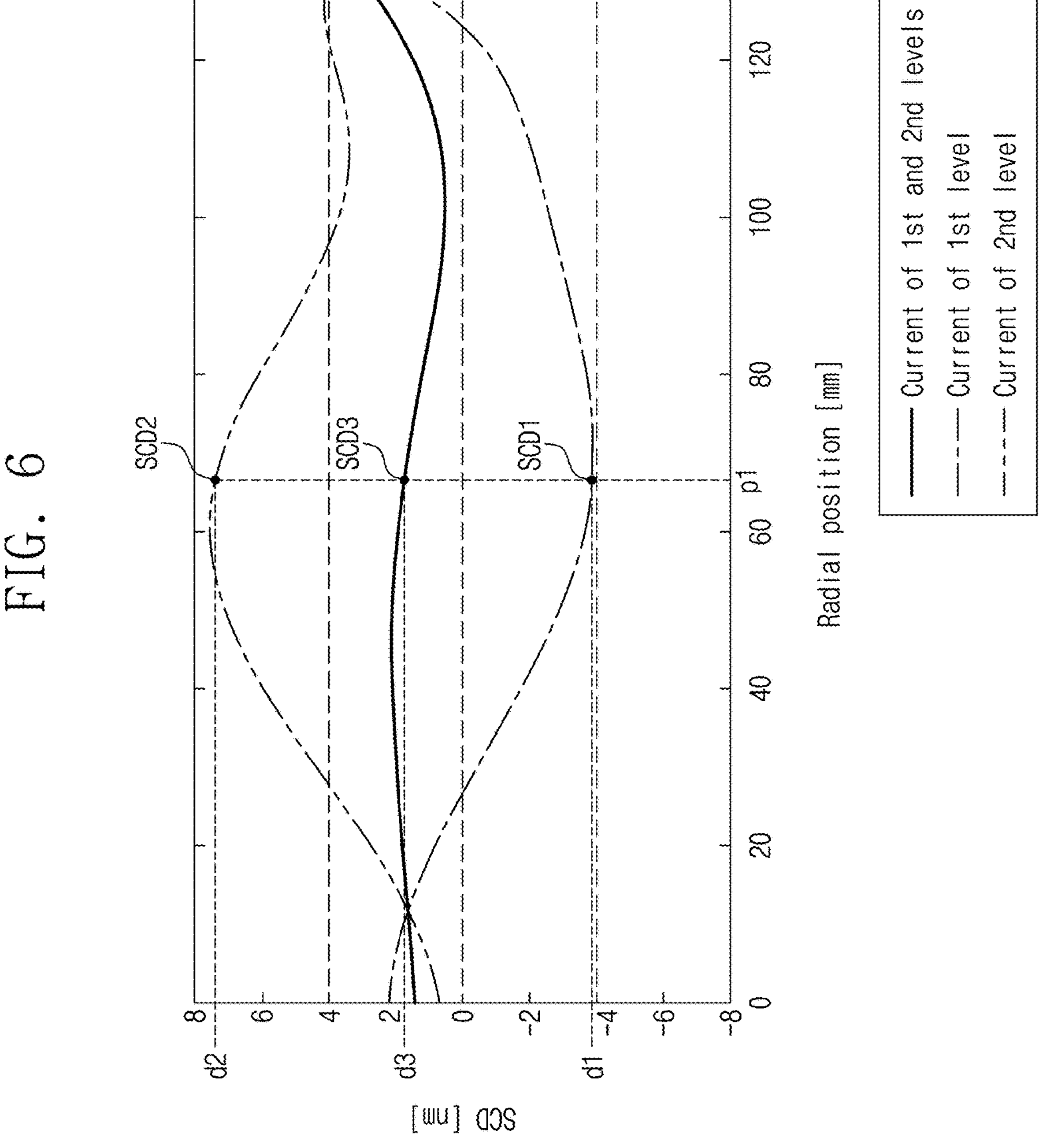
FIG. 6 is a view for explaining SCD according to embodiments of the present inventive concept.

FIG. 6 is a view for explaining SCD according to some embodiments of the present inventive concept. Referring to FIG. 6, the horizontal axis represents a radial distance of a wafer, and the vertical axis represents SCD.

In embodiments of the present inventive concept, the first electromagnet 141 of FIG. 2 may receive the first current DC1 of various current levels from the current supplier 150 of FIG. 2. For example, the first electromagnet 141 of FIG. 2 may receive the first current DC1, which is operated at the first and second current levels, from the current supplier 150 of FIG. 2. The first electromagnet 141 of FIG. 2 may generate the first magnetic field component of the first and second strengths based on the first current DC1 that is operated at the first and second current levels.

In embodiments of the present inventive concept, the first current DC1 of FIG. 2 may be repeated in the first cycle that includes the first time interval and the second time interval in sequence. In addition, the first current DC1 of FIG. 2 may have the first current level during the first time interval and the second current level during the second time interval. The first current level and the second current level may be different from each other. That is, the first electromagnet 141 of FIG. 2 may generate the first magnetic field component with the first strength based on the first current DC1 of the first current level during the first time interval and may generate the first magnetic field component with the second strength based on the first current DC1 of the second current level during the second time interval.

The dash-dot-dash line may represent the SCD when the first electromagnet 141 of FIG. 2 generates the first magnetic field component with the first strength based on the first current DC1 at the first current level. In addition, the dash-dot-dot line may represent the SCD when the first electromagnet 141 of FIG. 2 generates the first magnetic field component with the second strength based on the first current DC1 at the second current level. In other words, both the dash-dot-dash line and the dash-dot-dot line may represent the SCDs when the first electromagnet 141 of FIG. 2 generates the first magnetic field component with a single strength corresponding to the first current DC1 at a predetermined current level.

The solid line represents the SCD when the first electromagnet 141 of FIG. 2 sequentially and repeatedly generates the first magnetic field component of the first and second strengths based on the first current DC1 that is operated at the first and second current levels during one or more cycles. That is, the solid line may represent the SCD when the first electromagnet 141 of FIG. 2 generates the first magnetic field component with the first strength based on the first current DC1 at the first current level during the first time interval and generates the first magnetic field component with the second strength based on the first current DC1 at the second current level during the second time interval.

At the first location p1, the first SCD SCD1 on the dash-dot-dash line may be the first distance d1, the second SCD SCD2 on the dash-dot-dot line may be the second distance d2, and the third SCD SCD3 on the solid line may be the third distance d3. The first distance d1 may be between −2 nm and −4 nm, the second distance d2 may be between 6 nm and 8 nm, and the third distance d3 may be between 0 nm and 2 nm. That is, the SCD may be smaller when the first electromagnet 141 of FIG. 2 generates the first magnetic field component based on the first current DC1 being operated at two current levels, compared to when the first electromagnet 141 of FIG. 2 generates the first magnetic field component based on the first current DC1 being operated at only one current level.

FIG. 7 is a view illustrating a semiconductor process device according to embodiments of the present inventive concept. Referring to FIG. 7, the semiconductor process device 200 may include a first plasma electrode 231, a second plasma electrode 232, a first electromagnet 241, a current supplier 250, an RF power supplier 260, a matching circuit 270, and a communication device 280. The first plasma electrode 231, the second plasma electrode 232, the first electromagnet 241, and the current supplier 250 are respectively similar to the first plasma electrode 131, the second plasma electrode 132, the first electromagnet 141, and the current supplier 150 of FIG. 2, and therefore repetitive description thereabout will be omitted.

In a first step ①, the current supplier 250 may adjust the current level of a first current DC1. For example, the current supplier 250 may adjust the current level of the first current DC1 from a first current level to a second current level. In embodiments of the present inventive concept, the current supplier 250 may adjust the current level of the first current DC1 such that the first current DC1 having the first current level during a first time interval has the second current level during a second time interval. The current supplier 250 may provide the first current DC1 to the first electromagnet 241.

In embodiments of the present inventive concept, the current supplier 250 may perform a ramping operation of the first current DC1. For example, the current supplier 250 may perform a first ramping operation of the first current DC1 when the current level of the first current DC1 transitions from the first current level to the second current level and may perform a second ramping operation of the first current DC1 when the current level of the first current DC1 transitions from the second current level to the first current level. The time length of the ramping operation may range from about 0.1 seconds to about 10 seconds. For example, the length of time of each of the first and second ramping operations may range from about 0.1 seconds to about 10 seconds. The ramping operation of the first current DC1 will be described below in more detail with reference to FIG. 9.

In a second step ②, the current supplier 250 may provide time control information TCI. For example, the current supplier 250 may provide, to the communication device 280, the time control information TCI, which includes information about the time point or time interval at which the current level of the first current DC1 is adjusted. For example, the time control information TC1 includes information about the cycle of the first current DC1. In embodiments of the present inventive concept, the current supplier 250 is illustrated as providing the time control information TCI to the communication device 280, but the present inventive concept is not limited thereto. The current supplier 250 may directly or indirectly provide the time control information TCI to the matching circuit 270.

The RF power supplier 260 may provide RF power RFP to the first and second plasma electrodes 231 and 232. For example, the RF power supplier 260 may provide the high-frequency RF power RFP to the first and second plasma electrodes 231 and 232 such that the first and second plasma electrodes 231 and 232 excite a portion of a reactant gas into a plasma state to generate a plasma region. For example, the plasma may be generated through a process known as gas ionization facilitated by the high-frequency RF power RFP that is supplied to the first and second plasma electrodes 231 and 232.

In embodiments of the present inventive concept, the RF power supplier 260 may control the frequency of the RF power RFP independently of the sensitivity of an RF impedance matching operation. For example, the RF power supplier 260 may control the frequency of the RF power RFP independently of the sensitivity of the RF impedance matching operation such that the first and second plasma electrodes 231 and 232 generate the plasma region.

The matching circuit 270 may perform the RF impedance matching operation. For example, the matching circuit 270 may perform an RF impedance matching operation between the first and second plasma electrodes 231 and 232 and the RF power supplier 260. In embodiments of the present inventive concept, the matching circuit 270 may perform the RF impedance matching operation between the first and second plasma electrodes 231 and 232 and the RF power supplier 260 when an impedance change of the plasma region or an impedance change of the first and second plasma electrodes 231 and 232 occurs.

In a third step ③, the matching circuit 270 may receive the time control information TCI. For example, the matching circuit 270 may receive the time control information TCI from the communication device 280. In embodiments of the present inventive concept, the matching circuit 270 is illustrated as receiving the time control information TCI from the communication device 280, but the present inventive concept is not limited thereto. For example, the matching circuit 270 may directly or indirectly receive the time control information TCI from the current supplier 250.

In a fourth step ④, the matching circuit 270 may adjust (or control) the sensitivity of the RF impedance matching operation. For example, the matching circuit 270 may adjust (or control) the sensitivity of the RF impedance matching operation based on the time control information TCI. In embodiments of the present inventive concept, the matching circuit 270 may adjust (e.g., decrease) the sensitivity of the RF impedance matching operation based on the time control information TCI when the current level of the first current DC1 transitions.

The matching circuit 270 may provide matched RF power mRFP to the first and second plasma electrodes 231 and 232. For example, the matching circuit 270 may perform an impedance matching operation between the first and second plasma electrodes 231 and 232 and the RF power supplier 260, and may provide, to the first and second plasma electrodes 231 and 232, the matched RF power mRFP as a result of the impedance matching operation.

In embodiments of the present inventive concept, when the first current DC1 transitions from the first current level to the second current level, the strength of a first magnetic field component generated by the first electromagnet 241 may be changed from a first strength to a second strength. Thereafter, the impedance of the center region of the plasma region that is controlled by the first electromagnet 241 may be changed in response to the changed strength of the first magnetic field component, the matching circuit 270 may perform an RF impedance matching operation in response to the changed impedance, and the impedance of the plasma region may be further changed by the RF power that is changed by the result of the RF impedance matching operation (that is, the matched RF power mRFP). As a result, when the current level of the first current DC1 transitions, the impedance of the plasma region may be unnecessarily and more significantly changed by the RF impedance matching operation.

In embodiments of the present inventive concept, to minimize an extent of change in the impedance of the plasma region due to the RF impedance matching operation when the current level of the first current DC1 transitions, the matching circuit 270 may adjust (or, e.g., decrease) the sensitivity of the RF impedance matching operation based on the time control information TCI when the current level of the first current DC1 transitions. For example, the matching circuit 270 may decrease the sensitivity of the RF impedance matching operation during a third time interval including the time point at which the current level of the first current DC1 transitions from the first current level to the second current level. The adjustment of the sensitivity of the RF impedance matching operation will be described below in more detail with reference to FIG. 8.

In embodiments of the present inventive concept, the matching circuit 270 may adjust the sensitivity of the RF impedance matching operation independently of a magnetic field or a plurality of magnetic field components. For example, the matching circuit 270 may adjust the sensitivity of the RF impedance matching operation independently of the first magnetic field component that is generated by the first electromagnet 241 or the plurality of magnetic field components that are generated by the plurality of electromagnets 141 to 14N of FIG. 2.

The matching circuit 270 may include a variable capacitor 271 and a variable inductor 272. For example, to adjust the sensitivity of the RF impedance matching operation, the matching circuit 270 may include the variable capacitor 271 and the variable inductor 272. In embodiments of the present inventive concept, to adjust the sensitivity of the RF impedance matching operation, the matching circuit 270 may control the capacitance value of the variable capacitor 271, may control the inductance value of the variable inductor 272, or may control the capacitance value of the variable capacitor 271 and the inductance value of the variable inductor 272.

The communication device 280 may support communication between the current supplier 250 and the matching circuit 270. For example, the communication device 280 may support wireless or wired communication between the current supplier 250 and the matching circuit 270. In embodiments of the present inventive concept, the communication device 280 may provide, to the matching circuit 270, the time control information TCI that is provided by the current supplier 250.

Figure 8:
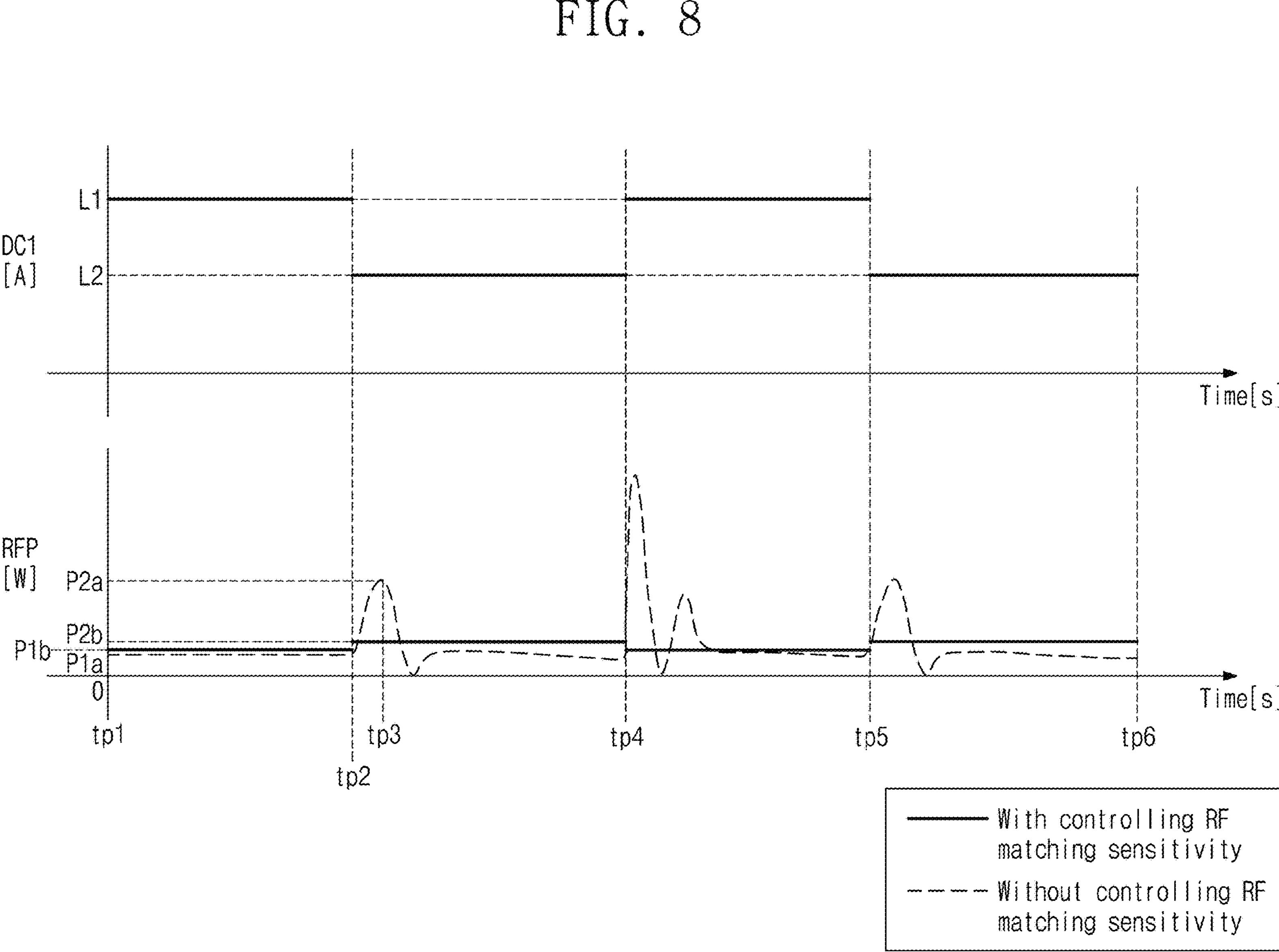
FIG. 8 is a view for explaining current levels of a current of the semiconductor process device according to embodiments of the present inventive concept.

FIG. 8 is a view for explaining current levels of a current of the semiconductor process device according to embodiments of the present inventive concept. Referring to FIG. 8, the horizontal axis represents time, and the vertical axis represents the current level of the first current DC1 and the RF power RFP.

The current supplier 250 of FIG. 7 may provide the first current DC1 at a plurality of current levels to the first electromagnet 241 of FIG. 7. For example, the first current DC1 may have a first current level L1 between the first time point tp1 and the second time point tp2 and may have a second current level L2 between the second time point tp2 and the fourth time point tp4.

The solid line may represent the RF power RFP when the matching circuit 270 of FIG. 7 controls the sensitivity of the RF impedance matching operation. For example, in the case in which the first current DC1 transitions from the first current level L1 to the second current level L2 at the second time point tp2, the solid line may represent the RF power RFP when the matching circuit 270 of FIG. 7 decreases the sensitivity of the RF impedance matching operation.

In addition, the dotted line may represent the RF power RFP when the matching circuit 270 of FIG. 7 does not control the sensitivity of the RF impedance matching operation.

Between the first time point tp1 and the second time point tp2, the solid line may correspond to the 1b-th power P1*b*, and the dotted line may correspond to the 1a-th power P1*a*. Between the second time point tp2, at which point the first current DC1 transitions from the first current level L1 to the second current level L2, and the third time point tp3, the solid line may rise from the 1b-th power P1*b* to the 2b-th power P2*b*, and the dotted line may rise from the 1a-th power P1*a* to the 2a-th power P2*a*. Between the second time point tp2 and the third time point tp3, the dotted line may rise more significantly than the solid line.

The RF power RFP may increase more significantly when the matching circuit 270 of FIG. 7 does not control the sensitivity of the RF impedance matching operation, compared to when the sensitivity is controlled by the matching circuit 270. Accordingly, the RF power RFP, which has risen more significantly, may more significantly change the impedance of the plasma region of FIG. 7, and the SCD may rise more significantly. That is, to minimize an error in an etching process for a wafer, the matching circuit 270 of FIG.

7 may adjust the sensitivity of the RF impedance matching operation based on the time control information TCI.

Figure 9:
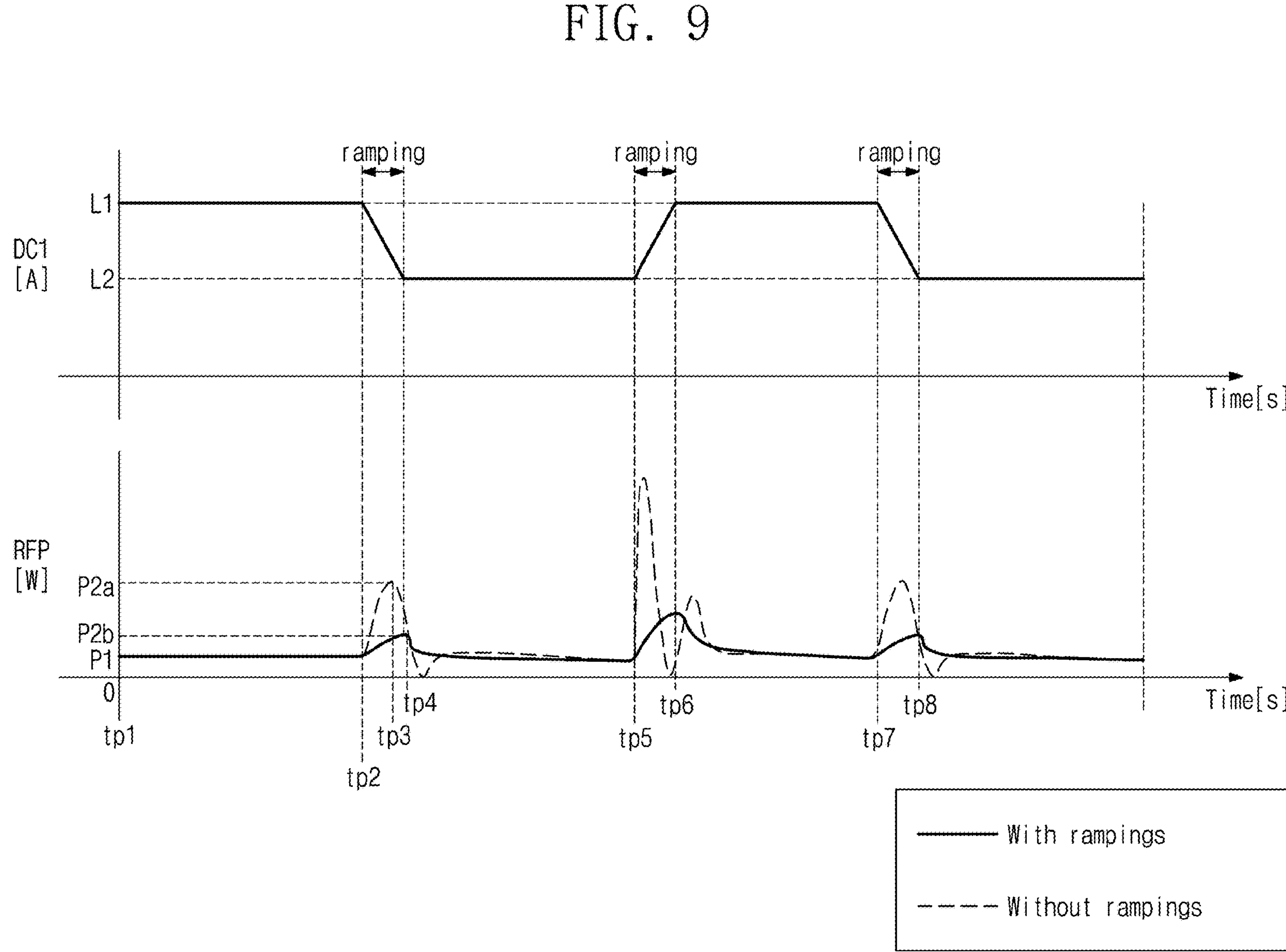
FIG. 9 is a view for explaining ramping of the semiconductor process device according to embodiments of the present inventive concept.

FIG. 9 is a view for explaining ramping of the semiconductor process device according to embodiments of the present inventive concept. Referring to FIG. 9, the horizontal axis represents time, and the vertical axis represents the current level of the first current DC1 and the RF power RFP.

The current supplier 250 of FIG. 7 may provide the first current DC1 at a plurality of current levels to the first electromagnet 241 of FIG. 7. For example, the first current DC1 may have the first current level L1 between the first time point tp1 and the second time point tp2 and may have the second current level L2 between the fourth time point tp4 and the fifth time point tp5.

In embodiments of the present inventive concept, the current supplier 250 of FIG. 7 may perform a ramping operation of the first current DC1. For example, the current supplier 250 of FIG. 7 may perform a ramping operation of the first current DC1 between the second time point tp2 and the fourth time point tp4. As a result of the ramping operation, the first current DC1 may gradually transition from the first current level L1 to the second current level L2 between the second time point tp2 and the fourth time point tp4 (as compared with when there is no ramping operation). For example, the ramping operation may be performed for at least 0.1 seconds.

The solid line may represent the RF power RFP when the current supplier 250 of FIG. 7 performs the ramping operation of the first current DC1. For example, in the case in which the first current DC1 transitions from the first current level L1 to the second current level L2 between the second time point tp2 and the fourth time point tp4, the solid line may represent the RF power RFP when the current supplier 250 of FIG. 7 performs the ramping operation of the first current DC1.

In addition, the dotted line may represent the RF power RFP when the current supplier 250 of FIG. 7 does not perform the ramping operation of the first current DC1.

Between the first time point tp1 and the second time point tp2, the solid line and the dotted line may each correspond to the first power P1. Between the second time point tp2 and the fourth time point tp4, when the first current DC1 transitions from the first current level L1 to the second current level L2, the solid line may rise from the first power P1 to the 2b-th power P2*b*, and the dotted line may rise from the first power P1 to the 2a-th power P2*a*. Between the second time point tp2 and the fourth time point tp4, the dotted line may rise more significantly than the solid line.

Accordingly, when the first current DC1 transitions, the RF power RFP may change more significantly when the current supplier 250 of FIG. 7 does not perform the ramping operation of the first current DC1, compared to when the current supplier 250 of FIG. 7 performs the ramping operation of the first current DC1. When the RF power RFP rises more significantly as described above, the impedance or density of the plasma region of FIG. 7 may change more significantly. As a result, significant changes in the impedance or density of the plasma region may lead to an increase in the SCD. That is, to minimize an error in an etching process of a wafer, the current supplier 250 of FIG. 7 may perform the ramping operation of the first current DC1.

According to the embodiments of the present inventive concept, the semiconductor process device including the electromagnet for controlling plasma is provided.

In addition, the semiconductor process device including the electromagnet for controlling plasma may stably control plasma density, thereby minimizing an error in an etching process.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor process device comprising:
a chamber;
a gas supplier configured to supply a reactant gas into the chamber;
a first plasma electrode disposed in the chamber;
a second plasma electrode disposed in the chamber and spaced apart from the first plasma electrode in a first direction;
a plurality of electromagnets configured to generate a plurality of magnetic field components, respectively, to control a density of a plasma region that is formed between the first and second plasma electrodes; and
a current supplier configured to supply a plurality of currents to the plurality of electromagnets, respectively,
wherein among the plurality of electromagnets, a first electromagnet is disposed closest to the plasma region,
wherein a center region of the plasma region is affected by the first electromagnet and has a first diameter in a second direction that is perpendicular to the first direction, and
wherein the first electromagnet has a second diameter less than or equal to the first diameter in the second direction.

2. The semiconductor process device of claim 1, wherein among the plurality of currents, a first current is provided to the first electromagnet and is repeated in a first cycle including a first time interval and a second time interval in sequence, wherein the first current has a first current level during the first time interval and a second current level during the second time interval,
wherein the first current level and the second current level are different from each other, and
wherein the first electromagnet generates a first magnetic field component having a first strength and a second strength based on the first current level and the second current level, respectively.

3. The semiconductor process device of claim 2, wherein the current supplier performs a first ramping operation of the first current when the first current transitions from the first current level to the second current level and performs a second ramping operation of the first current when the first current transitions from the second current level to the first current level.

4. The semiconductor process device of claim 3, wherein a length of time of each of the first ramping operation and the second ramping operation is at least 0.1 seconds.

5. The semiconductor process device of claim 3, wherein a length of time of each of the first and second ramping operations is greater than or equal to 0.1 seconds and less than or equal to 10 seconds.

6. The semiconductor process device of claim 2, wherein the first current is repeated in a second cycle subsequent to the first cycle, wherein the second cycle includes a third time interval and a fourth time interval in sequence, and the first current has a third current level during the third time interval and a fourth current level during the fourth time interval, and wherein the first to fourth current levels are different from one another.

7. The semiconductor process device of claim 2, wherein the first cycle further includes a third time interval subsequent to the second time interval, wherein the first current has a third current level during the third time interval, and wherein the third current level is different from each of the first and second current levels.

8. The semiconductor process device of claim 2, further comprising:

an RF power supplier configured to supply radio frequency (RF) power to the first and second plasma electrodes; and a matching circuit configured to perform an impedance matching operation between the first and second plasma electrodes and the RF power supplier.

9. The semiconductor process device of claim 8, wherein the current supplier provides time control information for the first cycle of the first current to the matching circuit, and wherein based on the time control information, the matching circuit adjusts sensitivity of the impedance matching operation when the first current transitions between the first current level and the second current level.

10. The semiconductor process device of claim 9, wherein the matching circuit includes a variable capacitor and a variable inductor to adjust the sensitivity.

11. The semiconductor process device of claim 9, wherein the matching circuit adjusts the sensitivity independently of the plurality of magnetic field components.

12. The semiconductor process device of claim 9, wherein the RF power supplier controls a frequency of the RF power independently of the sensitivity.

13. The semiconductor process device of claim 1, wherein a product value of a current and coil turns of the first electromagnet is greater than each of product values of currents and coil turns of remaining electromagnets among the plurality of electromagnets.

14. The semiconductor process device of claim 1, wherein maximum critical values of the plurality of currents are determined based on thermal characteristics of corresponding electromagnets, respectively.

15. The semiconductor process device of claim 1, wherein each of remaining electromagnets, other than the first electromagnet, among the plurality of electromagnets has a diameter greater than the second diameter in the second direction.

16. The semiconductor process device of claim 1, wherein the first electromagnet is disposed between the first plasma electrode and remaining electromagnets among the plurality of electromagnets.

17. The semiconductor process device of claim 16, wherein the remaining electromagnets are disposed outside the chamber.

18. The semiconductor process device of claim 1, wherein the first electromagnet is disposed inside the chamber.

19. A semiconductor process device comprising:

a chamber;

a gas supplier configured to supply a reactant gas into the chamber;

a first plasma electrode disposed in the chamber;

a second plasma electrode disposed in the chamber and spaced apart from the first plasma electrode in a first direction;

an electromagnet configured to generate a magnetic field component to control a density of a plasma region that is formed between the first and second plasma electrodes; and a current supplier configured to supply a current to the electromagnet, wherein the electromagnet is disposed inside the chamber, wherein a center region of the plasma region is affected by the electromagnet and has a first diameter in a second direction that is perpendicular to the first direction, and wherein the electromagnet has a second diameter less than or equal to the first diameter in the second direction.

20. A semiconductor process device comprising:

a chamber;

a gas supplier configured to supply a reactant gas into the chamber;

a first plasma electrode disposed in the chamber;

a second plasma electrode disposed in the chamber and spaced apart from the first plasma electrode;

a plurality of electromagnets configured to generate a plurality of magnetic field components, respectively, to control a density of a plasma region that is formed between the first plasma electrode and second plasma electrode; and a current supplier configured to supply a plurality of currents to the plurality of electromagnets, respectively, wherein a first electromagnet of the plurality of electromagnets is disposed between the plasma region and remaining electromagnets of the plurality of electromagnets, wherein a center region of the plasma region is affected by the first electromagnet, and wherein the first electromagnet overlaps the center region of the plasma region.

* * * * *